United States Patent [19]

Duncan et al.

[11] 4,389,377
[45] Jun. 21, 1983

[54] APPARATUS FOR GROWING A DENDRITIC WEB

[75] Inventors: Charles S. Duncan, Pittsburgh; Paul A. Piotrowski, Monroeville; Maria E. Skutch, Trafford; James P. McHugh, Pittsburgh, all of Pa.

[73] Assignee: The United States of America as represented by the United States Department of Energy, Washington, D.C.

[21] Appl. No.: 282,334

[22] Filed: Jul. 10, 1981

[51] Int. Cl.³ .................................................. C30B 15/10
[52] U.S. Cl. ............................. 422/246; 156/DIG. 84
[58] Field of Search ........ 156/608, DIG. 73, DIG. 84; 422/246, 253

[56] References Cited

U.S. PATENT DOCUMENTS

| | | | |
|---|---|---|---|
| 3,096,158 | 7/1963 | Gaulé et al. | 422/246 |
| 3,977,934 | 8/1976 | Lesk | 156/608 |
| 4,203,951 | 5/1980 | Goriletsky et al. | 156/608 |
| 4,271,129 | 6/1981 | Berkman et al. | 422/246 |

OTHER PUBLICATIONS

Webster's New World Dictionary, World Pub. 10, New York, 1968, p. 1374.

*Primary Examiner*—Hiram H. Bernstein
*Attorney, Agent, or Firm*—William E. Otto; Edward L. Levine

[57] ABSTRACT

A melt system including a susceptor-crucible assembly having improved gradient control when melt replenishment is used during dendritic web growth. The improvement lies in the formation of a thermal barrier in the base of the receptor which is in the form of a vertical slot in the region of the susceptor underlying the crucible at the location of a compartmental separator dividing the crucible into a growth compartment and a melt replenishment compartment. The result achieved is a step change in temperature gradient in the melt thereby providing a more uniform temperature in the growth compartment from which the dendritic web is drawn.

12 Claims, 7 Drawing Figures

४,३८९,३७७

APPARATUS FOR GROWING A DENDRITIC WEB

BACKGROUND OF THE INVENTION

1. Field of the Invention

This invention relates generally to apparatus for growing crystalline bodies from a melt and more particularly to a susceptor-crucible melt system providing dendritic web growth of silicon.

2. Description of the Prior Art

In the growth of silicon dendritic web in a melt system including an inductively heated susceptor which contains a crucible, melt replenishment has received considerable attention as a means of decreasing costs and improving crystal quality. In such a system, particles or pellets are added at one end of the crucible as the web crystals are grown; however, the heat absorbed in the region where melting of the replenishment takes place creats a significant thermal unbalance in the region from which the web is drawn. The ideal thermal situation would be one that would have a hot region where the pellets are added with the remainder of the crucible being totally unaffected. One approach known to those skilled in the art is the use of a barrier within the crucible to localize a relatively hot melt replenishment region from the region from which the dendritic web is drawn. Additionally, various types of thermal modifications have been made by varying the shielding or by moving the induction heating coil; however, the result of these changes tended to provide a linear temperature gradient between the melt region and the growth region which is accompanied by undesirable crystal characteristics.

SUMMARY OF THE INVENTION

Accordingly, it is an object of the present invention to provide improvements in the growth of a dendritic web of crystalline material.

It is another object of the present invention to overcome undesirable thermal gradients encountered in a susceptor-crucible melt system.

Still another object of the present invention is to provide a step-change in temperature gradient between melt replenishment and growth compartments of a susceptor-crucible melt system.

These and other objects are achieved by means of forming a substantially vertical slot of predetermined size and shape in the body of an inductively heated susceptor which is adapted to hold a crucible containing a melt from which a silicon dendritic web is drawn. The crucible contains separator means dividing the interior of the crucible into a relatively hot melt replenishment compartment and an adjacent growth compartment. The crucible separator means and the susceptor slot are located at substantially the same position so that thermal conduction is interrupted between the region of melt replenishment and the growth.

DESCRIPTION OF THE PREFERRED EMBODIMENTS

Figure 1:
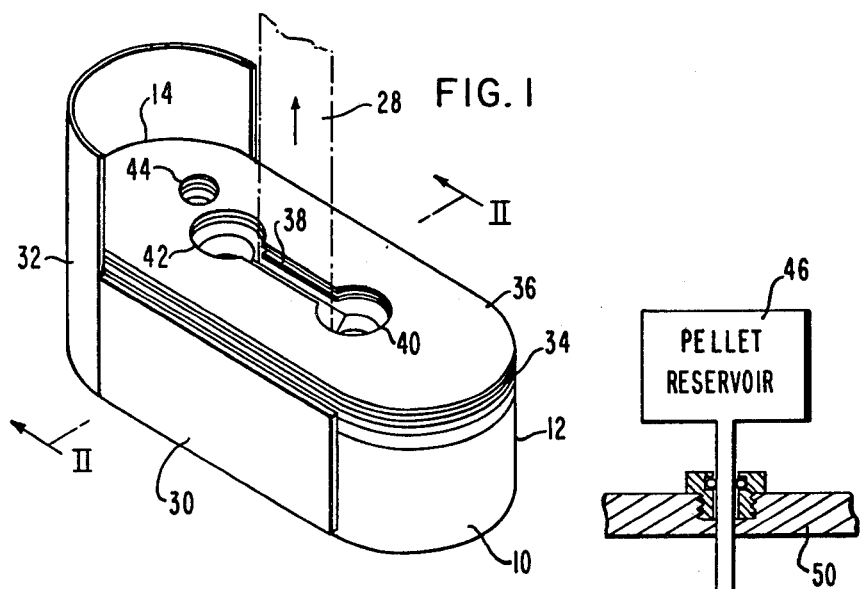
FIG. 1 is a perspective view of a typical susceptor-crucible assembly which utilizes the subject invention.
Figure 2:
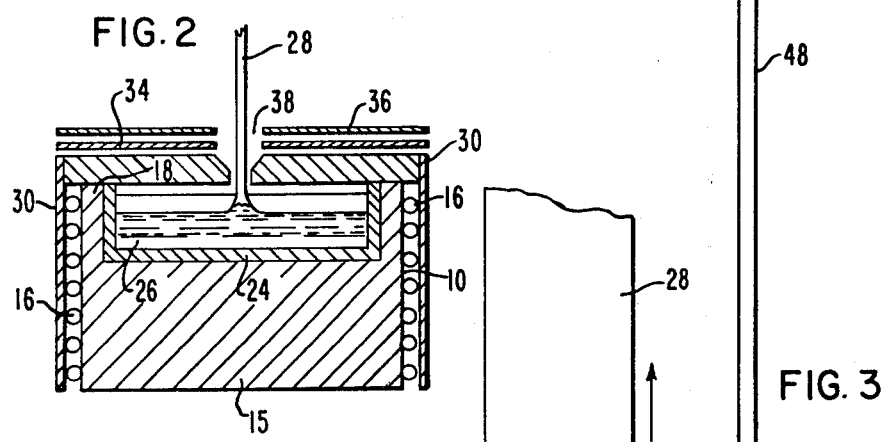
FIG. 2 is a cross sectional view of the assembly shown in FIG. 1 taken along the lines 2—2 thereof.
Figure 4:
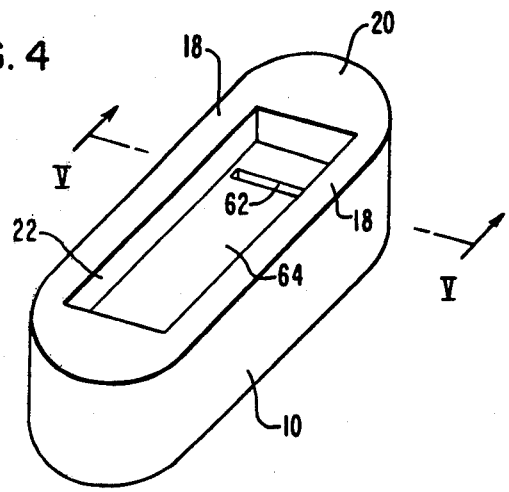
FIG. 4 is a perspective view generally illustrative of a susceptor body containing an embodiment of the subject invention.

Referring now to the drawings wherein like reference numerals refer to like parts, reference numeral 10 in FIG. 1 denotes an elongated susceptor body having rounded end portions 12 and 14. The susceptor body 10 shown in FIG. 2 includes a plurality of induction heating coils 16 externally located around the outer wall portion 18. The heating coils 16 encircle the structure to provide a heated interior region in a well known manner. While induction heating comprises the disclosed means of heating the susceptor a resistive heating arrangement can be utilized when desired. Within the upper surface 20 of the susceptor body 10 there is formed an elongated recess 22 as shown in FIG. 4 which is designed to accommodate a similarly shaped crucible 24 which contains a melt 26 of crystalline material such as silicon from which a dendritic web 28 is drawn. In order to confine the heat produced by the induction coils 16, the susceptor housing 10 is fitted with side heat shield members 30, an end heat shield 32 and a top heat shield 34 incorporated in a susceptor lid sub-assembly 36.

Figure 3:
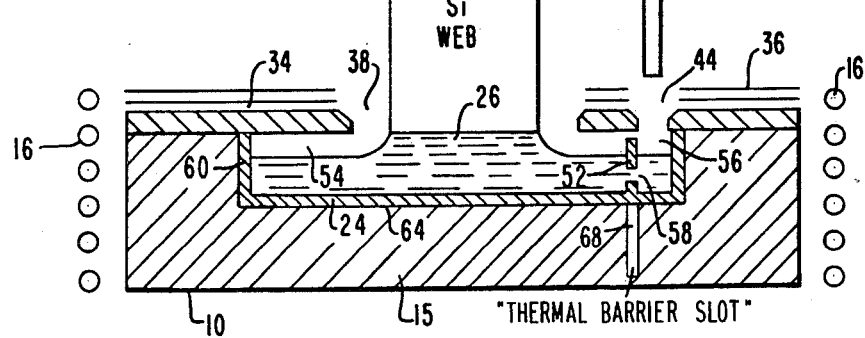
FIG. 3 is a simplified cross sectional view of a melt replenishment system incorporating the subject invention.

While FIG. 1 shows the dendritic web, in a phantom view, being drawn from the susceptor body 10, it is being drawn from a centrally located elongated aperture 38 terminated at either end by enlarged circular portions 40 and 42. Just behind the circular portion 42 is a feed hole 44 where particles or pellets of replenishing material, not shown, are delivered, for example, from a pellet reservoir 46 coupled to a pellet feed tube 48 as shown in FIG. 3. These elements are supported by the support structure 50 which comprises part of a growth chamber envelope, not shown. As noted earlier, the ideal thermal condition for a melt system which includes replenishment is one in which the region where the pellets are added is maintained at a relatively hot temperature with the remainder of the crucible having a relatively uniform temperature which is totally unaffected by the pellet melting region. One approach already known to those skilled in the art is the inclusion of a separator or barrier structure 52 as shown in FIG. 3 across the width dimension of the crucible 24 adjacent the feed hole 44 thereby dividing the interior of the crucible into a growth compartment 54 and a melt replenishment compartment 56. The separator structure 52 includes an opening 58 whereby the silicon pellets upon being heated to the melting state in the compartment 56 can flow into the growth compartment 54. Even with the barrier provided by the separator structure 52, it can be seen from FIG. 3 that a thermal gradient would normally exist as the melt 26 moves for example from the separator opening 58 to the opposite far wall 60, due to the heat conductivity of the base portion 15 susceptor body itself. In order to overcome this undesirable thermal gradient, the present invention contemplates the addition of a generally vertical slot 62 formed in the crucible support surface 64 of the recess 22 directly beneath the location of the separator structure 52. The effect of the slot 62 is to provide a thermal barrier or conduction discontinuity region which results in a step change in temperature between the growth region and the replenishment region.

Figure 5:
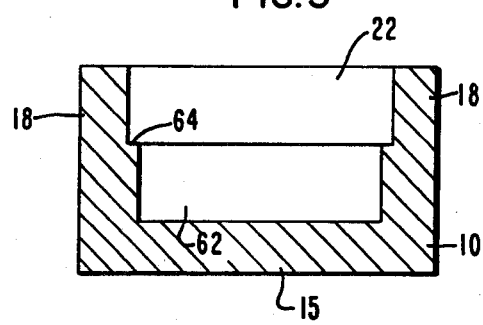
FIG. 5 is a cross sectional view of the susceptor body shown in FIG. 4 taken along the lines 5—5 and being illustrative of one type of slot which is formed therein.
Figure 6:
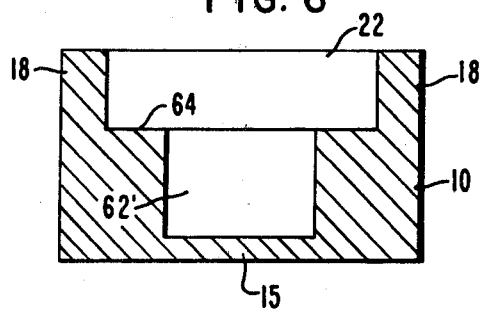
FIG. 6 is another cross sectional view similar to FIG. 5 illustrating another type of slot formed in the susceptor body.
Figure 7:
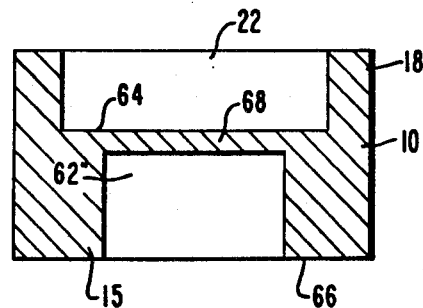
FIG. 7 is a cross sectional view similar to that shown in FIG. 5 being illustrative of still another type of slot formed in the susceptor body of FIG. 4.

Referring now to FIG. 4, it can be seen that the slot 62 in the surface 64 does not extend to the side wall portions 18 of the susceptor body 10 and therefore the inductive heating currents flowing in the side walls are not interrupted, only the thermal conduction mode of heat transfer is interrupted. Since an ideal thermal isolation is not possible radiation partly counteracts the reduced thermal conduction across the slot 62; however, this can be made substantially negligible by the specific design of the slot employed. FIGS. 5, 6 and 7, for example, disclose three different slot configurations. The design of the slot 62 as shown in FIG. 5 comprises a relatively shallow slot configuration having a width almost equal to the width of the recess 22. The shape of the slot of FIG. 6, on the other hand, is generally square in cross section, extending further into the base portion 15 of the susceptor body 10 but has a width substantially less than the width of the recess 22. The configuration of FIG. 7, on the other hand, shows the slot 62" being formed in the bottom wall 66 of the susceptor base portion 15 but it does not extend all the way through the recess 22, thus leaving an intervening section 68 therebetween.

Thus the slot size and shape depends on the amount of temperature drop desired. However, the wider and deeper the slot becomes, the more the temperature gradient is made to be flat and symmetrical in the growth region defined by the growth compartment 54.

Thus while the present invention has been shown and described with what is at present considered to be the preferred embodiments thereof, it should be pointed out that the foregoing detailed description has been made by way of illustration and not limitation and accordingly all modifications, changes and alterations coming within the spirit and scope of the invention is herein meant to be included.

I claim:

1. In a melt system for growing a dendritic web, and the like, comprised of a heated susceptor including a body within which a crucible is mounted, said crucible containing a melt of material from which the web is grown and including means for separating the interior of the crucible into a growth region and a replenishment region, the improvement comprising means in the body of said susceptor providing a region of thermal discontinuity in relatively close proximity to said crucible separating means whereby heat transfer in said susceptor body is modified to provide a non-linear change in temperature gradient between the growth and replenishment regions.

2. The melt system as defined by claim 1 wherein said change in temperature gradient comprises a relatively abrupt change and wherein said region of thermal discontinuity comprises a region of conductive thermal discontinuity in the body of the susceptor.

3. The melt system as defined by claim 2 wherein the susceptor body includes a thermally conductive base portion having a recess for supporting the crucible, said recess being bounded by susceptor outer wall portions and said thermally conductive base portion and wherein said region of thermal discontinuity is selectively formed in one of said susceptor body portions.

4. The melt system as defined by claim 3 wherein said thermal discontinuity is formed in the thermally conductive base portion of the susceptor body.

5. The melt system as defined by claim 4 wherein said susceptor comprises an inductively heated susceptor having inductive heater elements located adjacent said outer wall portions and wherein said region of thermal discontinuity is formed in the thermally conductive base portion substantially transverse to the susceptor body side wall portions.

6. The melt system as defined by claim 3 wherein said region of thermal discontinuity comprises a slot formed in the thermally conductive base portion of the susceptor body to provide a substantially step change in said temperature gradient.

7. The melt system as defined by claim 6 wherein said slot is formed in said base portion of the susceptor substantially directly beneath said crucible separating means.

8. The melt system as defined by claim 7 wherein said slot has a transverse dimension which is less than the width of said recess so that the slot does not extend into the wall portions of the susceptor body and thereby providing an uninterrupted inductive heating current path in the side wall portions of said susceptor body.

9. The melt system as defined by claim 8 wherein said slot comprises a slot of selected shape and size dependent upon the amount of thermal discontinuity desired.

10. The melt system as defined by claim 9 wherein said slot includes mutually parallel side surfaces extending substantially vertically into said conductive base portion and having a width extending in the lengthwise direction of the susceptor body of substantially the same dimensions as said crucible separating means of said crucible.

11. The melt system as defined by claim 10 wherein said slot has an upper side open to said recess.

12. The melt system as defined by claim 10 wherein said slot has a lower side open wall to the bottom wall of said conductive base portion.

* * * * *